(12) United States Patent
Romano et al.

(10) Patent No.: US 12,140,126 B2
(45) Date of Patent: Nov. 12, 2024

(54) PLASMA THRUSTER WITH BIRDCAGE ANTENNA

(71) Applicant: Universität Stuttgart, Stuttgart (DE)

(72) Inventors: Francesco Romano, Stuttgart (DE); Yung-An Chan, Stuttgart (DE); Georg Herdrich, Esslingen (DE); Stefanos Fasoulas, Stuttgart (DE)

(73) Assignee: Universität Stuttgart, Stuttgart (DE)

( * ) Notice: Subject to any disclaimer, the term of this patent is extended or adjusted under 35 U.S.C. 154(b) by 64 days.

(21) Appl. No.: 18/077,291

(22) Filed: Dec. 8, 2022

(65) Prior Publication Data
US 2023/0182929 A1    Jun. 15, 2023

(30) Foreign Application Priority Data

Dec. 10, 2021  (EP) .................................... 21213628

(51) Int. Cl.
| | |
|---|---|
| *F03H 1/00* | (2006.01) |
| *G01R 33/34* | (2006.01) |
| *H05H 1/54* | (2006.01) |
| *B33Y 80/00* | (2015.01) |

(52) U.S. Cl.
CPC ..... *F03H 1/0081* (2013.01); *G01R 33/34076* (2013.01); *H05H 1/54* (2013.01); *B33Y 80/00* (2014.12); *F03H 1/0093* (2013.01); *H05H 2245/00* (2013.01)

(58) Field of Classification Search
CPC .............................. F03H 1/0081; F03H 1/0093
See application file for complete search history.

(56) References Cited

PUBLICATIONS

Romano "RF Helicon-based Inductive Plasma Thruster (IPT) Design for an Atmosphere-Breathing Electric Propulsion system (ABEP)" (Year: 2020).*
Bhatia "Geometrically Decoupled Phased Array Coils for Mouse Imaging" (Year: 2009).*
AMFG "How Can 3D Printing Benefit Metal Casting? Here are 3 ways" (Year: 2018).*
(Continued)

*Primary Examiner* — Arun Goyal
*Assistant Examiner* — William L Breazeal
(74) *Attorney, Agent, or Firm* — Renner, Kenner, Greive, Bobak, Taylor & Weber

(57) ABSTRACT

A plasma thruster comprises a cylindrical discharge channel (1), an injector (4), a RF antenna surrounding the discharge channel (1) and a device (3) for generating an axial static magnetic field in the discharge channel (1). The RF antenna is a cylindrical birdcage antenna (2) formed of several electrically conductive parallel legs (10) connected by two end rings (11) including capacitors (12) between adjacent legs (10) in each case. The two end rings (11) with the capacitors (12) are formed on two printed circuit boards (14) to which the legs (10) are attached, said printed circuit boards (14) having a through opening for the discharge channel (1). The antenna maximizes electrical coupling efficiency and provides resulting electromagnetic fields for quasi-neutral plasma acceleration along with the magnetic field effect provided by the externally applied magnetic field. This plasma thruster allows an easy upscaling or downscaling due to the printed circuit boards and is particularly suitable for low power applications like propulsion for smaller spacecrafts or satellites.

5 Claims, 4 Drawing Sheets

(56) References Cited

PUBLICATIONS

Wikipedia "Stepper Motor" (Year: 2021).*

Romano F. et al. "RF Helicon-based Inductive Plasma Thruster (IPT) Design for an Atmosphere-Breathing Electric Propulsion system (Abep)", ACTA Astronautica, Pregamon Press, Elmsford, GB, vol. 176, Jul. 10, 2020 (Jul. 10, 2020), pp. 476-483, XP086325666, ISSN: 0094-5765, DOI: 10.1016/J. ACTAASTRO.2020.07.008 [retrieved on Jul. 10, 2020 ] *p. 477-p. 481; figures 1,4,6*.

Romano Francesco et al: "Design, Set-Up, and First Ignition of the RF Helicon-based Plasma Thruster", Space Propulsion 2020+1, Mar. 19, 2021 (Mar. 19, 2021), pp. 1-9, xp055916522, Retrieved from the Internet: URL:https://discoverer.space/wp-content/uploads/2021/07/247_ROMANO.pdf [retrieved on Apr. 29, 2022] *sections 2,4; figure 9*.

Lopez Rios Nibardo et al: "Design and construction of an optimized transmit/receive hybrid birdcage resonator to improve full body images of medium-sized animals in 7T scanner", PLOS One, vol. 13, No. 2, Feb. 1, 2018 (Feb. 1, 2018). p. e0192035, XP055916551, DOI: 10.1371/journal.pone.0192035 *figure 2*.

Extended European Search Report, European Patent Office, dated May 17, 2022, 4 pages.

* cited by examiner

PLASMA THRUSTER WITH BIRDCAGE ANTENNA

TECHNICAL FIELD

The present invention relates to a plasma thruster, in particular for the propulsion of spacecrafts and/or satellites, comprising a cylindrical discharge channel and a RF antenna surrounding the discharge channel, said RF antenna when fed with RF power generating electromagnetic fields that ionize the propellant forming a plasma in the discharge channel that is then ejected through an outlet to generate thrust. The plasma thruster also comprises an injector for injecting the propellant into the discharge channel and a device for generating an axial static magnetic field in the discharge channel that has two main functions: one is to aid the formation of helicon waves within the plasma resulting in greater efficiency, and the second is, due to its divergence in the outlet region, to (partially) accelerate and eject a quasi-neutral plasma for thrust generation. Such a plasma thruster is also known as a helicon plasma thruster.

In a helicon plasma thruster, the propellant that is injected into the cylindrical discharge channel is converted into a plasma by the electromagnetic waves of the radio frequency (RF) antenna. The axial magnetic field, which is typically generated by means of a solenoid or a system of permanent magnets, causes the generation of helicon waves in the plasma. These are circularly polarized and develop within the plasma that is formed inside the cylindrical discharge channel. The presence of helicon waves enables a more efficient power coupling than comparable inductive or capacitive plasma systems. By the combined effect of the electromagnetic field configuration produced by the RF antenna, and the static magnetic field, a quasi-neutral plasma is ejected at high velocity from the discharge channel to generate thrust. The quasi-neutrality of the plasma at the outlet removes the need of a neutralizer device that is commonly used for conventional electric thrusters, such as Hall-effect and gridded/RF ion thrusters. Such a plasma thruster can be used for propulsion of small spacecrafts and/or satellites, and can also be scaled for use on larger spacecrafts as well as on CubeSats. On the other hand, such a plasma thruster, may also be adapted as a plasma source for terrestrial applications.

PRIOR ART

F. Romano et al., "RF Helicon-based Inductive Plasma Thruster (IPT) Design for an Atmosphere-Breathing Electric Propulsion System (ABEP)", Acta Astronautica, Vol. 176, 2020, pages 476-483, describes a helicon plasma thruster in which the RF antenna is a cylindrical birdcage antenna formed of a number of electrically conductive parallel legs connected to each other by a mechanical structure at the top and at the bottom of the legs, called end ring. The end rings comprise capacitors between adjacent legs in each gap to adjust the birdcage antenna resonance frequency to the one required by the application. The injector is made of an electrically conductive material and mounted movable along a symmetry axis of the plasma thruster allowing a fine tuning of the resonance frequency. The publication is silent about the technical realization of the birdcage antenna and only refers to a birdcage with eight legs in a high pass design. A critical issue of such an antenna is the connection of the legs with the end ring and capacitors which should be reliable and withstand the operational temperatures.

It is thus an object of the present invention to provide an helicon-based plasma thruster which is particularly suitable for low power propulsion of smaller satellites or spacecrafts, providing a high efficiency by making use of a birdcage antenna, designed in such way to be easy to mount, reliable, and to withstand the operational temperatures.

SUMMARY OF THE INVENTION

The object is achieved with the plasma thruster according to claim 1. Advantageous embodiments are subject of the dependent claims or can be extracted from the subsequent portions of the description.

The proposed plasma thruster comprises a cylindrical discharge channel having an inlet for a propellant and an outlet, an injector for injecting the propellant through the inlet into the discharge channel, a RF antenna surrounding the discharge channel, said RF antenna when fed with RF power generating electromagnetic fields that ionize the propellant forming a plasma in the discharge channel that is then ejected through the outlet to generate thrust, and a device for generating an axial static magnetic field in the discharge channel, said magnetic field aiding the formation of helicon waves within the plasma as well as providing quasi-neutral plasma acceleration and ejection. In the proposed plasma thruster, the REF antenna is a cylindrical birdcage antenna formed of a number of electrically conductive parallel legs connected by two end rings on each side, wherein said end rings comprise one or several capacitors between adjacent legs in each case, said capacitors providing the electrical connection between the legs and defining the resonance frequency of the birdcage antenna. The injector is made of an electrically conductive material and mounted movable along the cylinder axis of the birdcage antenna for the fine tuning of the resonance frequency. The proposed plasma thruster is characterized in that the two end rings with the capacitors are soldered on two printed circuit boards (PCB) to which the legs are attached, said printed circuit boards having a through opening for the discharge channel.

The proposed plasma thruster is operated at one of its resonant frequencies defined mainly by the antenna and the surrounding conductive surfaces. The antenna resonance frequency is, in particular, determined by the geometry of the legs and end rings and the number and capacitance of the implemented capacitors. To this end, the desired resonance frequency is set to the frequency output of the selected RF generator that provides power to the RF antenna, or vice versa if a variable frequency generator is used. The operation at one of the resonance frequencies minimizes losses (reflected power) and ohmic heating. Furthermore, as a birdcage antenna has multiple resonance frequencies (resonance modes), the operation at the specific m=1 resonance mode, produces a linearly polarized electromagnetic field within the cross section of the discharge channel that additionally provides a drift velocity for ions and electrons in the thrust direction. The additional axial magnetic field initiates helicon waves in the plasma with corresponding higher efficiency for plasma discharge as well as the effect of a magnetic nozzle which further accelerates the charged particles through the outlet. The thruster generates a quasi-neutral plasma jet that does not require an additional neutralizer, which is needed in alternative conventional Hall-effect and/or gridded/RF ion thrusters. The proposed birdcage antenna uses two printed circuit boards (PCB) onto which the capacitors are soldered, forming the end rings and to which the legs are attached. Those are easy to produce, and allow a reliable mounting which also ensures a resistance to heat of the corresponding electrical connections. The use of the PCBs allows a simple scalability for industrial fabrication of the thruster, i.e., an easy upscaling or downscaling. Furthermore, the use of PCBs on both ends of the birdcage antenna also allows to easy substitute the PCBs with PCBs having different capacitors for operation at different frequencies. Generally, the use of PCB facilitates manufacturing and integration in mass production.

Preferably the legs comprise feet for fastening on both ends. Due to their geometry, these legs are preferably manufactured by a combination of a 3D-printing and a casting technology. Such a technology foresees the 3D printing of the desired geometry in plastic/wax. Such model is then surrounded with a fine plaster that then solidifies. The whole is heated and the plastic/wax melts/burns creating a mold. The fluid brass is injected and the solidifies, providing the desired part. This enables complex geometries like the formation of the legs with the desired curvature, with feet in one single piece which would be difficult to manufacture by conventional machining. The use of this combination of technologies also enables the possibility of rapid prototyping for the different antenna configurations and their verification which reduces development time and cost. The use of the 3D-printing technology with the casting method also prevents the degradation of electrical properties of the antenna resulting from the uncontrollable quality of standard 3D-printing methods, such as the internal porosity of the electrical conductor and the respective surface quality.

In a preferred embodiment, the printed circuit boards are placed on isolating flanges to which the legs are fixed by means of screws and nuts (made of insulating material) via through holes in the feet, in the printed circuit boards and in the flanges. Preferably, the PCBs and the isolating flanges have the form of rings.

In order to adapt or fine tune the resonance frequency of the birdcage antenna, the movable injector may comprise an electric drive, in particular a stepper motor or piezo drive, for movement of the injector along the cylinder axis of the birdcage antenna. This allows a remote controlled or automatic tuning of the resonance frequency. The proposed plasma thruster may very advantageously be used for propulsion of small spacecrafts and/or small satellites. Due to its relatively easy scalability, it can also be used on larger satellites. Nevertheless, also a use as plasma source for terrestrial applications is possible.

BRIEF DESCRIPTION OF THE DRAWINGS

The proposed plasma thruster is described in the following in detail by means of an exemplary embodiment and corresponding figures. The figures show.

DETAILED DESCRIPTION OF EMBODIMENTS

Figure 1:
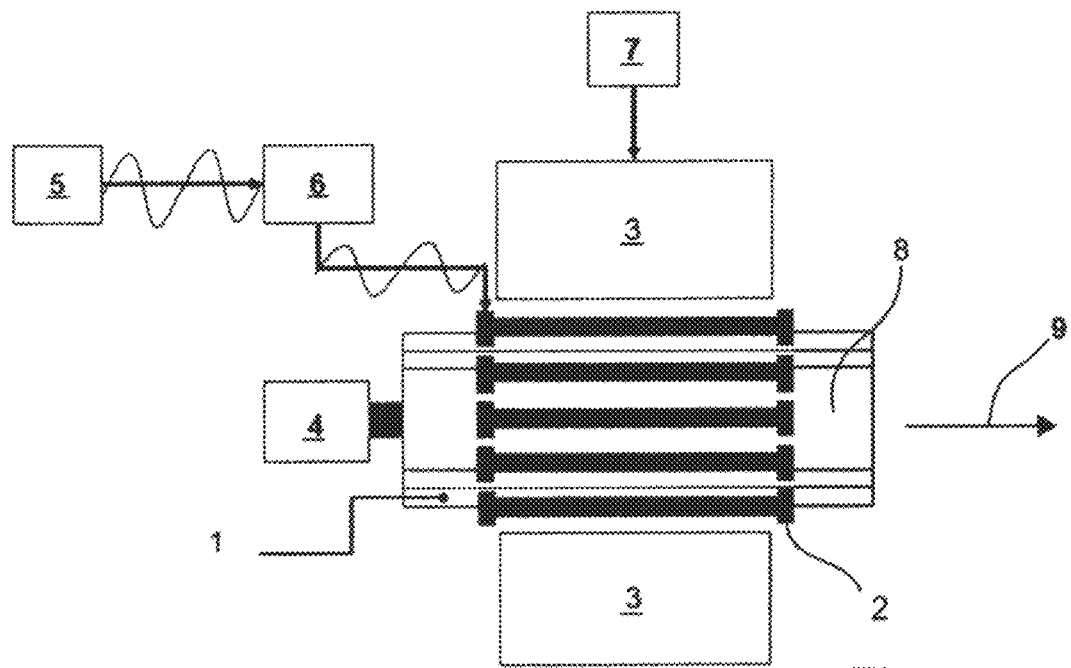
FIG. 1 an example of a plasma thruster system in schematic representation.

FIG. 1 shows an example of a complete plasma thruster system using a plasma thruster according to the present invention. The plasma thruster consists of the cylindrical discharge channel 1 surrounded by the birdcage antenna 2. The birdcage antenna 2 on the other hand is surrounded by a solenoid 3 (alternatively by an arrangement of permanent magnets) applying an axial static magnetic field along the discharge channel 1. The propellant is injected into the discharge channel 1 by an injector 4. An RF generator 5 combined with a matching network 6 provides the RF power to the birdcage antenna 2. The solenoid 3 is supplied by a DC power supply 7. By applying the RF power to the birdcage antenna 2 the propellant in the discharge channel 1 is converted into a plasma 8 by the electromagnetic waves generated with the birdcage antenna 2. The axial magnetic field provides the boundary condition for the generation of helicon waves in the plasma 8. The birdcage antenna-generated electromagnetic fields in conjunction with the applied static magnetic field provide the acceleration of the quasi-neutral plasma 8 which is ejected through the outlet of the discharge channel 1 as a plasma jet 9 generating the corresponding thrust.

Figure 2:
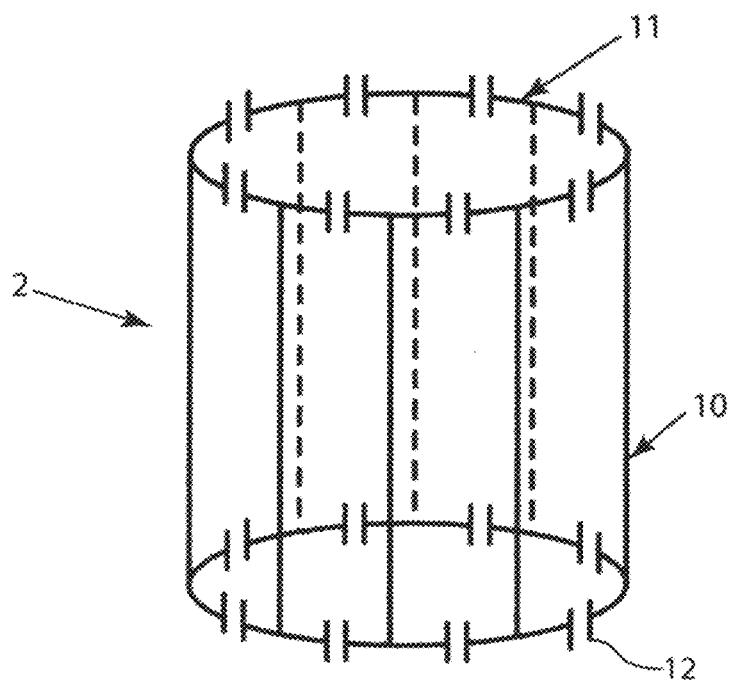
FIG. 2 a schematic view of a birdcage antenna in high pass configuration as used in the present invention.

FIG. 2 shows a schematical representation of a birdcage antenna 2 in a high pass configuration used in the proposed plasma thruster. In this example the birdcage antenna 2 consists of eight legs 10 connected by two end rings 11 on each side. At each end ring 11, between each two legs 10, capacitors 12 are included in the end ring 11. These capacitors 12 are used to provide the desired resonant frequency of the birdcage antenna 2, which is related to the excitation frequency of the power unit (RF generator 5), for example a frequency of 40.68 MHz. In the present example, the birdcage antenna 2 comprises eight legs 10. The proposed plasma thruster may however also have a birdcage antenna 2 with a higher or lower number of legs 10.

Figure 3:
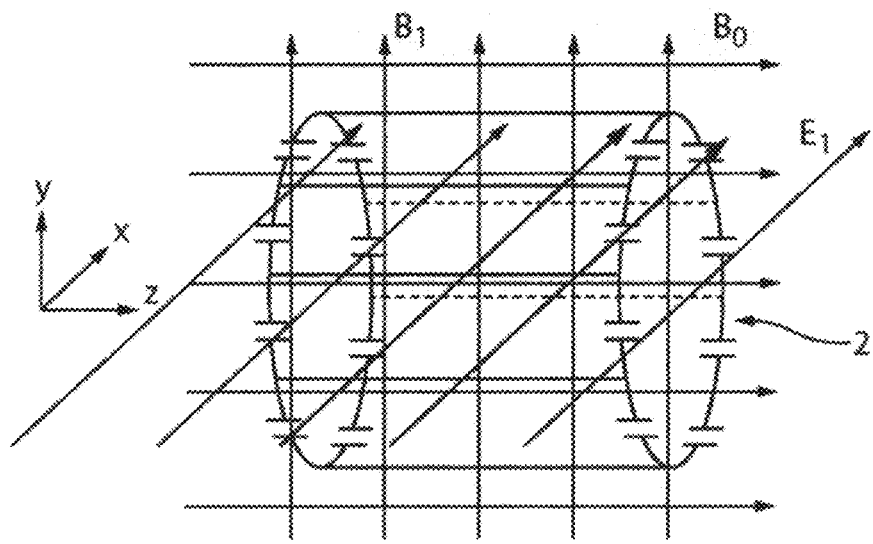
FIG. 3 a schematic view of the electromagnetic fields generated via the birdcage antenna and the externally applied axial static magnetic field.

By operating at one of the resonant frequencies of the birdcage antenna 2, the antenna is optimized, also from the point of view of minimizing the reflected power loss and ohmic losses. This means that an antenna impedance $Z_{antenna}=50+j0\Omega$ can be achieved. Other resonant modes have reactance of $X_{antenna}=0\Omega$, but $R_{antenna}$ can be different than 50Ω. Standard RF generators, which have an output impedance of $Z_{RF}=50+j0\Omega$ can provide an electric power coupling of more than 99.99%. At the desired resonance mode of the birdcage antenna, this also results in homogeneous and linearly polarized magnetic and electric fields ($E_1$, $B_1$) in the transverse cross section of the plasma cylinder (discharge channel 1). Such configurations provide drift velocity to both ions and electrons at the same time and in the thrust direction and, therefore, increases the thrust generated by the plasma thruster. Furthermore, the static magnetic field $B_0$ provides a divergence at the outlet of the discharge channel 1 and, thus, the effect of a magnetic nozzle, which further accelerates the quasi-neutral plasma and, thus, also increases the thrust. The corresponding electromagnetic fields ($E_1$, $B_1$) as well as the externally applied static magnetic field $B_0$ are schematically indicated in FIG. 3.

Figure 4:
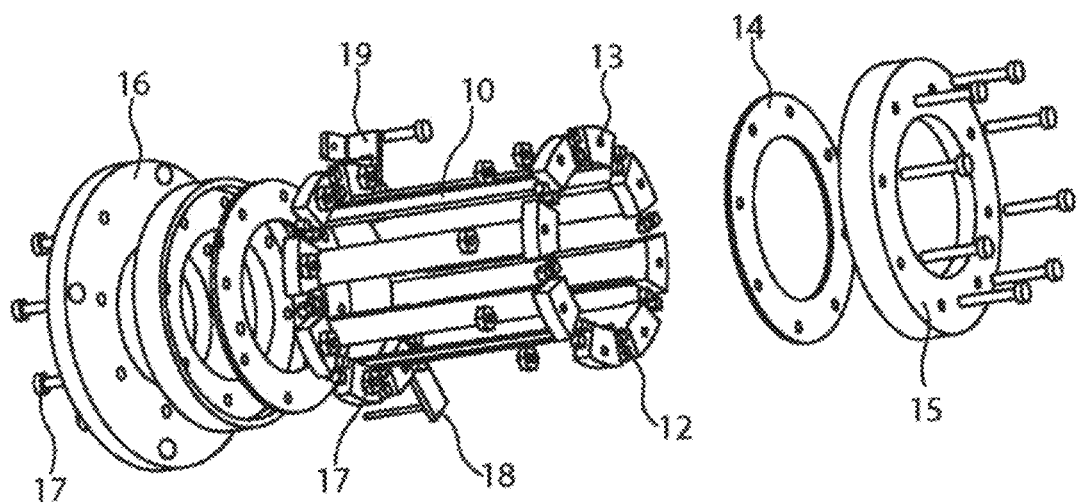
FIG. 4 an example for the components and design of the birdcage antenna of the proposed plasma thruster.

A very important aspect of the present invention is the design of the birdcage antenna 2. FIG. 4 exemplary shows an explosion view of components for mounting the birdcage antenna 2. Essential features of this antenna are the two printed circuit boards 14 (PCB), on which the antenna legs 10 are directly attached and to which the capacitors 12 between the antenna legs are soldered. The end ring of the birdcage antenna 2 is also formed on the corresponding circuit boards 14. In the present example a very advantageous form of the legs 10 with feet 13 on each side is shown. In cross section perpendicular to the cylinder axis, the legs 10 and feet 13 have a cross sectional shape corresponding to the cross section of cylinder jacket sections of a hollow cylinder with the same cylinder axis. The legs are preferably formed by combining a 3D-printing and casting technology to produce the antenna legs out of copper. This system is particularly suitable for low power applications and thus for small satellites.

Figure 5:
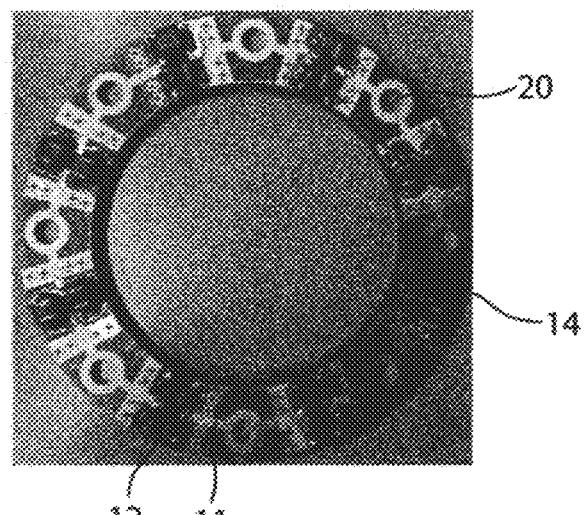
FIG. 5 a photo of one of the printed circuit boards used for the birdcage antenna of FIG. 4 in plan view.

The 3D-printing and casting technology guarantees the conductivity of the copper and at the same time the desired shape of the legs (and feet). The printed circuit boards 14 are connected to the antenna by means of PEEK screws and corresponding nuts 17 as indicated in FIG. 4. These withstand high temperatures and at the same time insulate electrically. The capacitors 12 are soldered to the PCBs (as shown in FIG. 5). RF ground 19 and RF input 18 are connected to the antenna legs 10. The grounding uses an electrically conductive screw to dissipate any reflected power. The RF input connector is directly soldered or clamped. Two aluminum oxide flanges 15 are used to hold the structure together. These are electrically insulating and resistant to high temperatures. The PTFE flange 16 attached at the top, has the task of holding the overall structure while providing electrical insulation. As can be seen from FIG. 4, the legs 10 are fixed via through holes in the feet 13, the PCB board 14 and the aluminum oxide flanges 15 with the screws and nuts 17.

FIG. 5 shows a photo of one of the PCB boards 14 in plan view. In this plan view the end ring 11 of the birdcage antenna together with the capacitors 12 can be recognized. The figure also shows the through holes 20 for fixing the legs 10.

Figure 6:
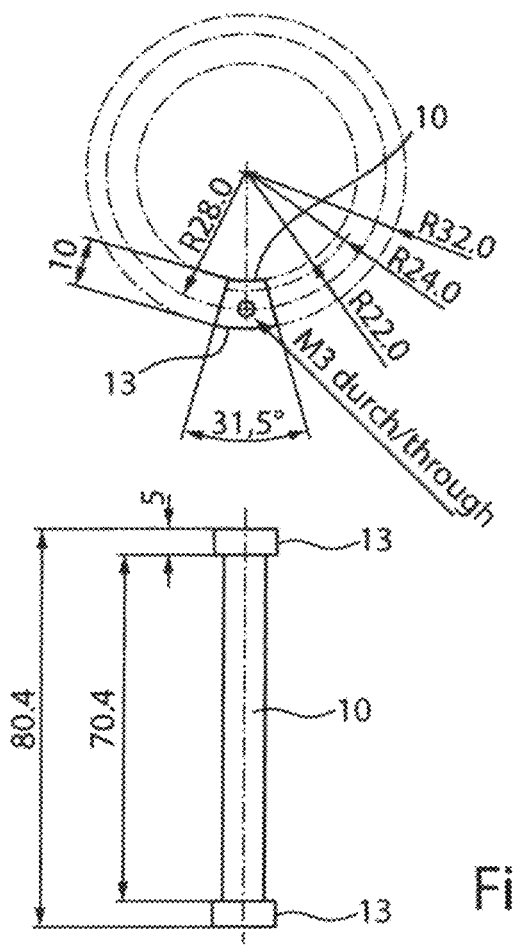
FIG. 6 a side view and a cross sectional view of one the legs of the birdcage antenna of FIG. 4.

FIG. 6 shows a side view and a top view on one of the legs 10 with the feet 13 on both ends together with exemplary dimensions in millimeters. The antenna itself is preferably isolated from the outside by a Faraday shield. This is made of a conductive material and—in the application on a satellite—is very advantageous as it isolates the satellite electronics from the electromagnetic fields of the plasma thruster. It also isolates the birdcage antenna from parasitic external electromagnetic fields.

Figure 7:
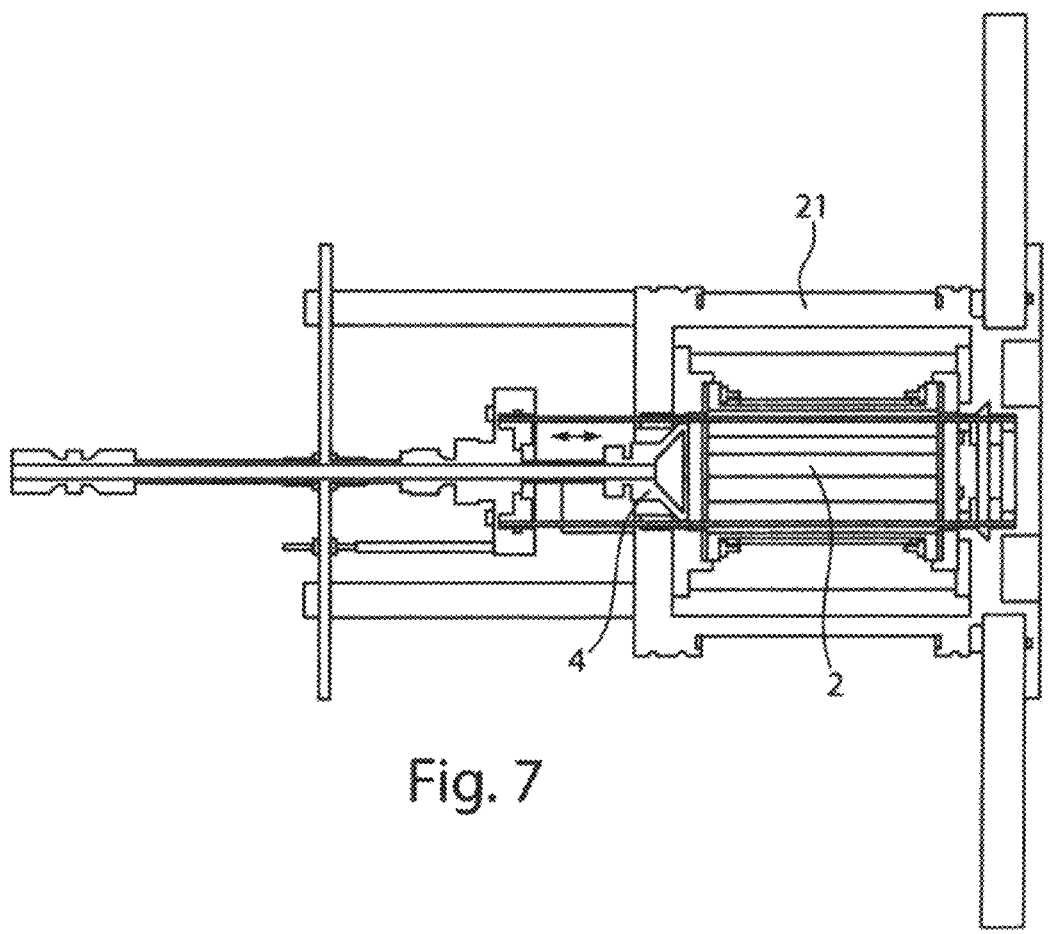
FIG. 7 a cross sectional view of an example of the proposed plasma thruster.

FIG. 7 shows a cut view of an example of the proposed plasma thruster in which the Faraday shield 21 is also indicated. The figure also indicates the movement possibility of the injector 4 by the double arrow in the figure. The plasma thruster is designed to resonate at a specific frequency, for example 40.68 MHz. The birdcage antenna 2 can be designed to resonate at this frequency by appropriate selection of the capacitors 12 in the end rings 11. However, as the electronic components used in practice are not ideal and have always some deviations as well as the assembly and integration always have some tolerances, a fine adjustment of the resonance frequency is required. This is achieved by the movable injector 4 made of an electrically conductive material, in the present example brass. This injector can be moved along the thruster's axis of symmetry or cylindrical axis of the birdcage antenna as indicated in FIG. 7. When this injector 4 is moved within/very close to the antenna region, the thruster's resonance frequency shifts upwards. The extent of movement defines the increment of frequency that can be finally controlled. With such a movable injector, for example, a fine tuning of the resonance setting of the antenna with an interval range of 0.01-0.05 MHz is possible. The movement of the injector can be made manually or can also be achieved with an appropriate electric drive, in particular a stepper motor, to automatize the adjustment.

LIST OF REFERENCE SIGNS 1 discharge channel
2 birdcage antenna
3 solenoid
4 injector
5 RF generator
6 matching network
7 DC power supply
8 plasma
9 plasma jet
10 leg
11 end ring
12 capacitor
13 foot
14 PCB board
15 $Al_2O_3$ flange
16 PTFE flange
17 PEEK screws and nuts
18 RF input
19 RF ground
20 through hole
21 Faraday shield

The invention claimed is:

1. A plasma thruster comprising:
a cylindrical discharge channel (1) having an inlet for a propellant and an outlet,
an injector (4) for injecting the propellant through the inlet into the cylindrical discharge channel (1),
an RF antenna surrounding the cylindrical discharge channel (1), said RF antenna when fed with RF power generating electromagnetic fields that ionize the propellant forming a plasma (8) in the cylindrical discharge channel (1) that is then ejected through the outlet to generate thrust,
a magnetic field generator (3) for generating an axial static magnetic field in the cylindrical discharge channel (1), said axial static magnetic field providing boundary conditions for formation of helicon waves within the plasma (8), as well as providing a magnetic nozzle effect at the outlet for quasi-neutral plasma acceleration, wherein
the RF-antenna is a cylindrical birdcage antenna (2) formed of a number of electrically conductive parallel legs (10) connected by two end rings (11) on each side, said two end rings (11) comprising one or several capacitors (12) between adjacent legs (10) among the number of electrically conductive parallel legs in each case, said one or several capacitors (12) defining a resonance frequency of the cylindrical birdcage antenna (2), and
the injector (4) is made of an electrically conductive material and mounted movably along a cylinder axis of the cylindrical birdcage antenna (2) for fine tuning of the resonance frequency,
wherein the two end rings (11) with the one or several capacitors (12) are soldered on two printed circuit boards (14) to which the number of electrically conductive parallel legs (10) are attached, said two printed circuit boards (14) having a through opening for the cylindrical discharge channel (1), wherein the number of electrically conductive parallel legs (10) comprise feet (13) for fastening on both ends of each of the number of electrically conductive parallel legs, and the two printed circuit boards (14) on which the one or several capacitors (12) are soldered, are placed on isolating flanges (15) to which the number of electrically conductive parallel legs (10) are fixed by means of screws and nuts (17) through holes in the feet (13), in the two printed circuit boards (14) and in the isolating flanges (15).

2. The plasma thruster according to claim 1, characterized in that the legs (10) are formed by a combination of 3D-printing and casting technology.

3. The plasma thruster according to claim 1, characterized in that the two printed circuit boards (14) and isolating flanges (15) have the form of rings.

4. The plasma thruster according to claim 3, characterized in that in cross-section perpendicular to the cylinder axis, the number of electrically conductive parallel legs (10) and feet (13) have a cross-sectional shape corresponding to the cross-section of cylinder jacket sections of a hollow cylinder.

5. The plasma thruster according to claim 1, characterized in that the injector (4) is provided with an electric drive a stepper motor or piezoelectric actuator, for movement of the injector (4) along the cylinder axis of the cylindrical birdcage antenna (2).

* * * * *